(12) United States Patent
Goward

(10) Patent No.: US 10,453,711 B2
(45) Date of Patent: Oct. 22, 2019

(54) FLUIDIC PICK-UP HEAD FOR SMALL SEMICONDUCTOR DEVICES

(71) Applicant: Facebook Technologies, LLC, Menlo Park, CA (US)

(72) Inventor: John Michael Goward, Ayr (GB)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 15/610,252

(22) Filed: May 31, 2017

(65) Prior Publication Data
US 2018/0351030 A1    Dec. 6, 2018

(51) Int. Cl.
*H01L 21/67*    (2006.01)
*H01L 23/00*    (2006.01)
*H01L 33/00*    (2010.01)
*H01L 25/075*    (2006.01)

(52) U.S. Cl.
CPC .. *H01L 21/67092* (2013.01); *H01L 21/67144* (2013.01); *H01L 24/00* (2013.01); *H01L 33/0095* (2013.01); *H01L 25/0753* (2013.01)

(58) Field of Classification Search
CPC .................................. B25J 15/06; H01L 21/68
See application file for complete search history.

(56) References Cited

U.S. PATENT DOCUMENTS

| 5,169,196 A | * | 12/1992 | Safabakhsh | ........ H05K 13/0409 |
| | | | | 294/64.3 |
| 2008/0066511 A1 | * | 3/2008 | Kim | ....................... B21D 43/18 |
| | | | | 72/20.1 |
| 2013/0026775 A1 | * | 1/2013 | Sydorko | ............... B25B 11/007 |
| | | | | 294/183 |
| 2013/0126081 A1 | * | 5/2013 | Hu | .......................... H01L 24/75 |
| | | | | 156/249 |
| 2015/0357256 A1 | * | 12/2015 | Suthiwongsunthorn | ..................... |
| | | | | H01L 21/6836 |
| | | | | 257/734 |
| 2017/0140961 A1 | * | 5/2017 | Sasaki | ..................... H01L 22/22 |

* cited by examiner

*Primary Examiner* — Jay C Chang
*Assistant Examiner* — Mikka Liu
(74) *Attorney, Agent, or Firm* — Fenwick & West LLP

(57) ABSTRACT

A method and system for manufacturing a device by picking and placing semiconductor devices from a carrier substrate to a target substrate using fluidic material as a transfer medium. The method may include releasing a first amount of fluidic material from a tip of a pick-up head to form a fluidic membrane on the tip, and bringing the fluidic membrane on the tip of the pick-up head in contact with a semiconductor device on a carrier substrate to attach the semiconductor device to the fluidic membrane. The method can further include releasing a second amount of the fluidic material from the tip of the pick-up head to separate the semiconductor device from the pick-up head and place the semiconductor device on a target substrate.

19 Claims, 12 Drawing Sheets

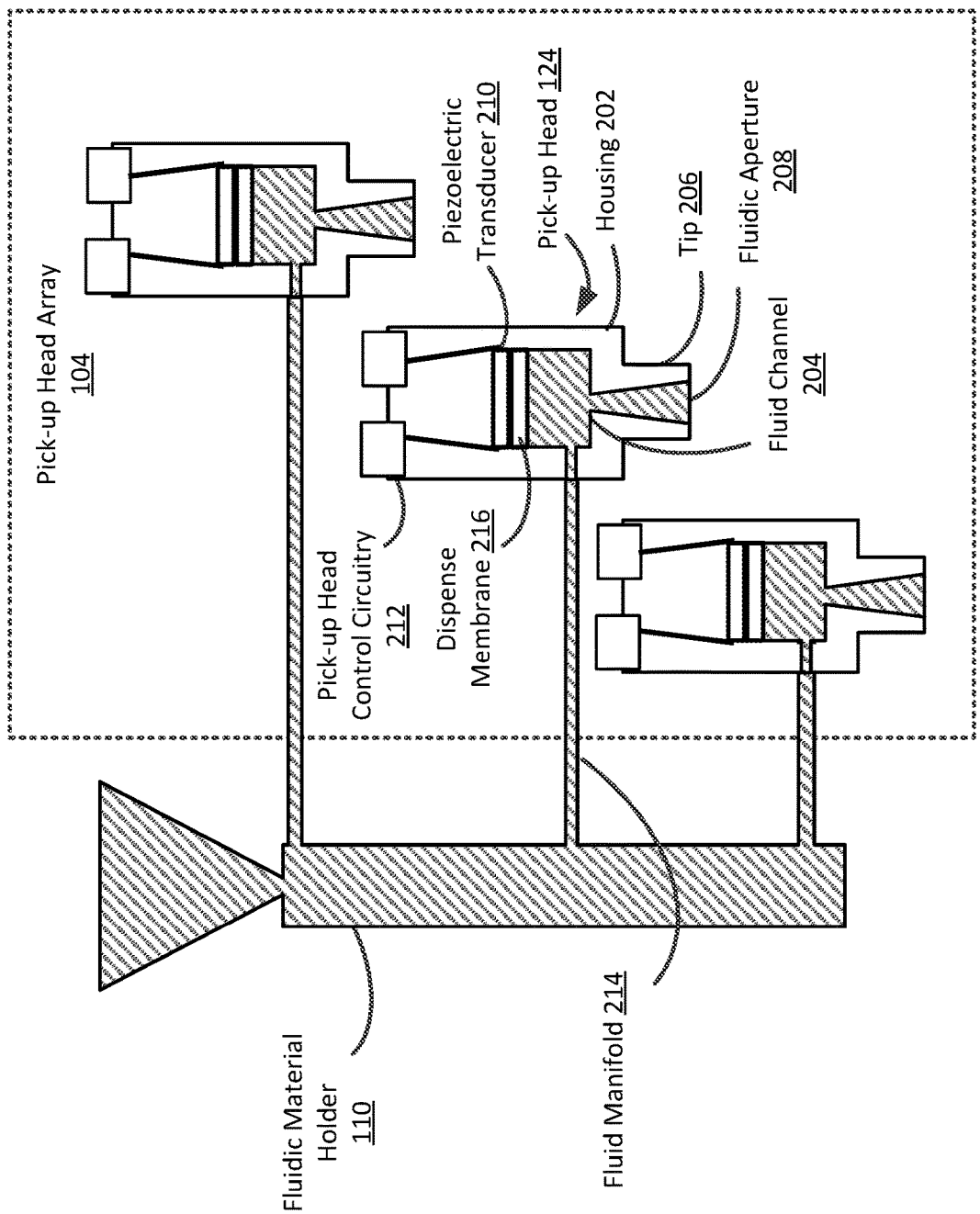

400

Release a first amount of fluidic material from a tip of a pick-up head to form a fluidic membrane on the tip
410

Bring the fluidic membrane on the tip of the pick-up head in contact with a semiconductor device on a carrier substrate to attach the semiconductor device to the fluidic membrane
420

Remove the semiconductor device form the carrier substrate by lifting the pick-up head with the semiconductor device attached to the fluidic membrane on the tip of the pick-up head
430

Release a second amount of the fluidic material from the tip of the pick-up head to separate the semiconductor device from the pick-up head and place the semiconductor device at a location on a target substrate
440

Fig. 4

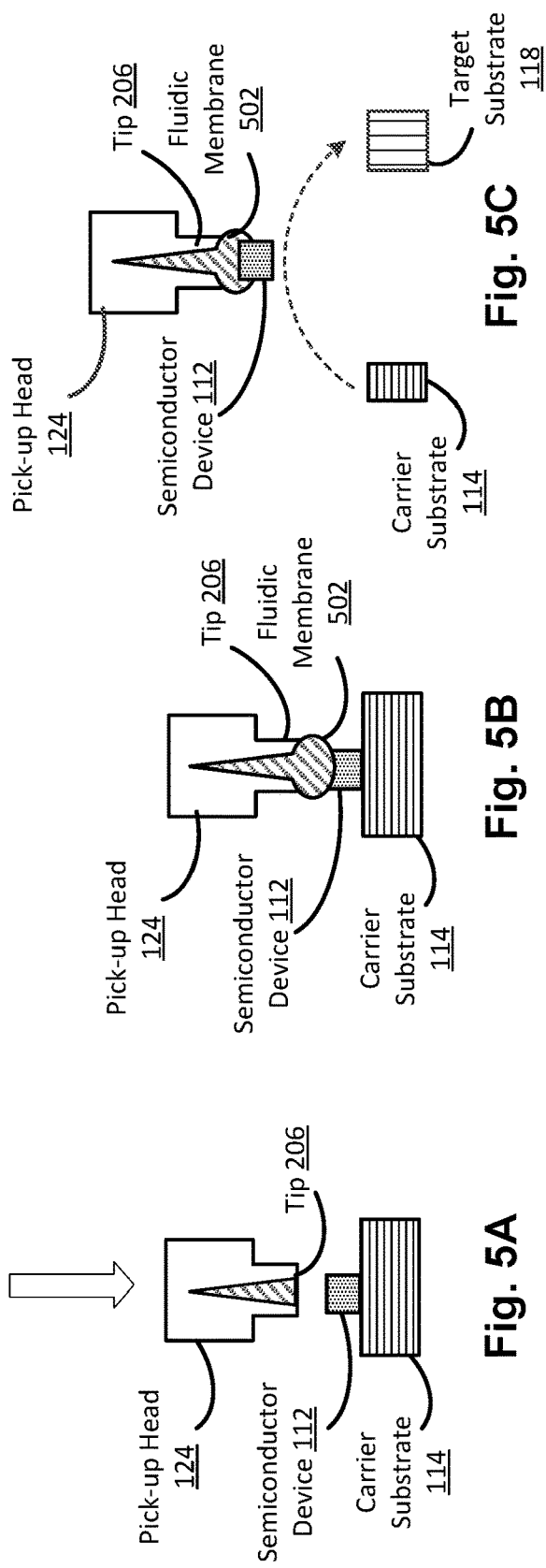

800

```
┌─────────────────────────────────────────────────────────┐
│ Release first amounts of fluidic material from a         │
│ plurality of tips of the array of tips to attach the     │
│ plurality of LEDs with the plurality of tips             │
│                          810                             │
└─────────────────────────────────────────────────────────┘
                            │
                            ▼
┌─────────────────────────────────────────────────────────┐
│ Release second amounts of the fluidic material from the  │
│ plurality of tips to place the plurality of LEDs at a    │
│ plurality of target locations on an intermediate carrier │
│ substrate                                                │
│                          820                             │
└─────────────────────────────────────────────────────────┘
                            │
                            ▼
┌─────────────────────────────────────────────────────────┐
│ Align target locations of a display substrate with the   │
│ plurality of LEDs on the intermediate carrier substrate  │
│                          830                             │
└─────────────────────────────────────────────────────────┘
                            │
                            ▼
┌─────────────────────────────────────────────────────────┐
│ Transfer the plurality of LEDs to the display substrate  │
│ from the intermediate carrier substrate using a direct   │
│ bonding process                                          │
│                          840                             │
└─────────────────────────────────────────────────────────┘
```

Fig. 8

FLUIDIC PICK-UP HEAD FOR SMALL SEMICONDUCTOR DEVICES

BACKGROUND

The present invention relates to a multi device pick-up head and assembly process for use in, but not exclusively limited to, pick and place of very small display element(s) that need to be transferred from an initial substrate to a receiving substrate using a micro fluidic pick-up and transfer process.

To populate a display with very small light emitting diodes (LEDs), such as micro-LEDs, there may be a need to transfer the LEDs from the native substrate on which they have been manufactured to a target substrate that forms part of a display, or "display substrate." Such small semiconductor devices may be assembled with a defined separation distance between them or closely packed together on the target substrate. Because of the small size of these devices (e.g., smaller than 49×40 µm), conventional pick and place techniques are unsuitable.

Vacuum pick-up, transfer printing, and electrostatic pick-up are some techniques that have been applied to the pickup and placement of small electronic devices. Each of these techniques has various drawbacks. For example, vacuum pick-up tools are typically limited to serial pick and place of individual devices. In another example, transfer printing uses direct contact (under high pressure) with the devices that are to be picked and placed, resulting in pick-up heads with limited work life or physical damage to the devices. In another example, the use of electrostatic forces to pick and transfer LED's can result in potential to damage electrostatic discharge (ESD) sensitive devices.

SUMMARY

Embodiments relate to using a fluidic material as a transfer medium for picking and placing a semiconductor device, such as a micro-LED. A first amount of fluidic material is released from a tip of a pick-up head to form a fluidic membrane on the tip. The fluidic membrane is brought on the tip of the pick-up head in contact with a semiconductor device on a carrier substrate to attach the semiconductor device to the fluidic membrane.

In one or more embodiments, a second amount of the fluidic material is released from the tip of the pick-up head to separate the semiconductor device from the pick-up head and place the semiconductor device on a target substrate.

BRIEF DESCRIPTION OF THE DRAWINGS

FIG. 2 is a schematic diagram illustrating a pick-up head array of the display assembly system, in accordance with one embodiment.

FIG. 4 is a flowchart illustrating a process for picking and placing a semiconductor device with a pick-up head, in accordance with one embodiment.

FIGS. 5A, 5B, 5C, 5D and 5E are schematic diagrams illustrating the picking and placing of a semiconductor device with a pick-up head, in accordance with one embodiment.

FIG. 8 is a flowchart illustrating a process for manufacturing a display device using a pick-up head array and an intermediate carrier substrate, in accordance with one embodiment.

The figures depict embodiments of the present disclosure for purposes of illustration only.

DETAILED DESCRIPTION

Embodiments relate to the picking and placing of semiconductor devices, such as light emitting diodes (LEDs), using a fluidic material as a transfer medium. A pick-up head array may include an array of individual pick-up heads that can each release fluidic material. Each pick-up head can release fluidic material to form a fluidic membrane on the tip of the pick-up head that can pick up a semiconductor device from a carrier substrate. With the semiconductor device attached to the pick-up head via the fluidic membrane, the pick-up head again releases fluidic material to separate the semiconductor device from the pick-up head and place the semiconductor device on a target substrate.

Among other things, the pick-up head array allows multiple semiconductor devices to be picked up simultaneously, such as to efficiently populate sub-pixels of pixels of a display device. Using the fluidic material as the transfer media for picking and placing of the semiconductor devices avoids direct contact between the pick-up heads and the semiconductor devices, and thus the likelihood of damaging the semiconductor devices or manufacturing tools during device fabrication is decreased.

System Overview

Figure 1:
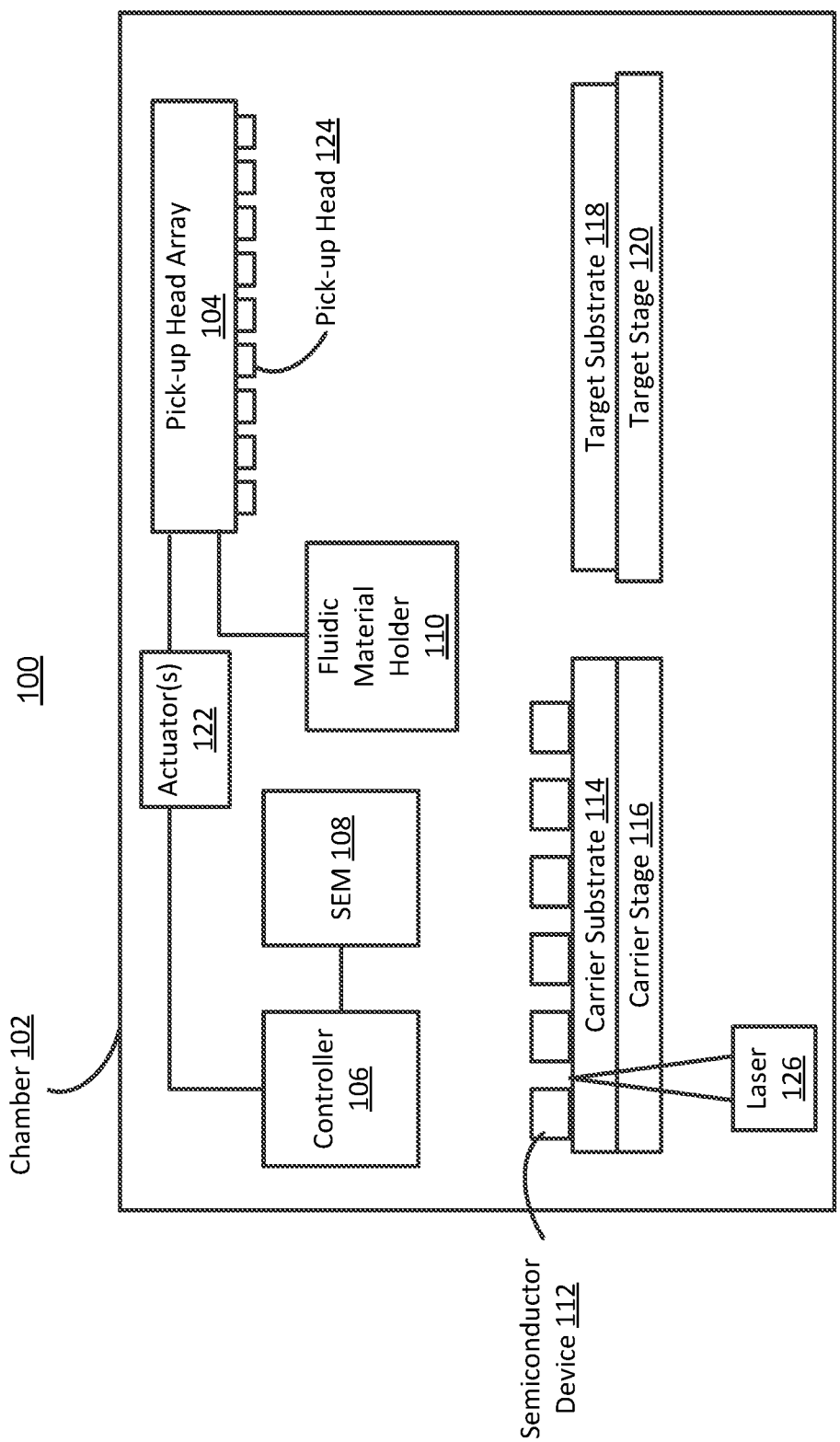
FIG. 1 is schematic diagram illustrating a display assembly system, in accordance with one embodiment.

FIG. 1 is a block diagram illustrating a display assembly system 100, in accordance one embodiment. The system 100 fabricates a display device by assembling semiconductor devices 112 from a carrier substrate 114 to a target substrate 118. In some embodiments, the semiconductor devices 112 are different color light emitting diode (LED) dies. The carrier substrate 114 may be a carrier film that holds the semiconductor devices 112 for pick up by the pick-up head array. The target substrate 118 may be a display substrate, or may be an intermediate carrier substrate that facilitates bonding with a display substrate. The system 100 places LEDs at pixel locations of the display substrate, and then bonds the LEDs to the display substrate. In some embodiments, the semiconductor devices 112 are micro-LEDs having a reduced divergence of light output and small light emitting area.

The system 100 may include, among other components, a scanning electron microscope (SEMS) chamber 102 defining an interior environment for picking and placing semiconductor devices 112 within the SEM chamber 102. The system 100 further includes a pick-up head array 104, a scanning electron microscope (SEM) 108, a fluidic material holder 110, an actuator 122, a carrier stage 116, a target stage 120, and a dicing laser 126, within the SEM chamber 102. The carrier stage 116 holds a carrier substrate 114 having semiconductor devices 112. The target stage 120 holds a target substrate 118 to receive some or all of the semiconductor devices 112 from the carrier substrate 114. A controller 106 is coupled to the SEM 108 and the pick-up head array 104 (e.g., via the actuator 122) and controls the operations of the SEM 108 and pick-up head array 104. For example, the controller 106 causes the pick-up head array 104 to pick up one or more semiconductor devices 112 located on a carrier substrate 114, and place the one or more semiconductor devices on the target substrate 118.

The pick-up head array 104 includes a plurality of pick-up heads 124. Each pick-up head 124 can pick up a semiconductor device 112 from the carrier substrate 114, and place the semiconductor device on the target substrate 118. Each pick-up head 124 is connected with the fluidic material holder 110 storing a fluidic material. The fluidic material is released from the tip of a pick-up head 124 to form a fluidic membrane on the tip. The fluidic membrane on the pick-up head 124 provides a surface tension or attractive force (e.g., by covalent or Van der Wall attractive forces, or other such attractive forces) that is used to pick up a semiconductor device 112 from the carrier substrate 114. After picking up a semiconductor device 112 with the fluidic membrane, the pick-up head 124 is aligned with a location on the target substrate 118. The pick-up head 124 releases additional fluidic material from the fluidic material holder 110 at the tip of the pick-up head 124. The fluidic material separates the semiconductor device 112 from the pick-up head 124 and places the semiconductor device 112 at the location on the target substrate 118.

The actuator 122 is an electro-mechanical component that controls the movement of the pick-up head array 104 based on instructions from the controller 106. For example, the actuator 122 may move the pick-up head array 104, or individual pick-up heads 124, with three degrees of freedom including up and down, left and right, and forward and back. The actuator 122 may be embodied, for example, as a rotating motor, a linear motor or a hydraulic cylinder.

The SEM 108 facilitates a visual alignment for semiconductor device pick-up from the carrier substrate 114, and alignment for semiconductor device placement on the target substrate 118. For example, the SEM 108 generates images of the pick-up head array 104 and the carrier substrate 114, and provides the images to the controller 106. The controller 106 aligns the one or more pick-up heads 124 of the pick-up head array 104 with the carrier substrate 114 based on the images, and picks up one or more semiconductor devices 112 mounted on the carrier substrate 114. In another example, the SEM 108 generates images of the one or more pick-up heads 124 of the pick-up head array 104 and the target substrate 118, and provides the images to the controller 106. The controller 106 aligns the one or more pick-up heads 124 with the display substrate 118 based on the images, and places the semiconductor devices 112 attached to the one or more pick-up heads 124 on the display substrate 118.

In some embodiments, the SEM 108 is an environmental scanning electron microscope (ESEM) to provide images without specimen coating. The SEM chamber 102 is an ESEM chamber including a high pressure atmosphere of water vapor. The use of an SEM is advantageous for picking and place small semiconductor device, such as micro-LED dies. In various embodiments, other types of imaging devices may be used to facilitate the alignments.

In some embodiments, the carrier stage 116 and/or target stage 120 may be adjusted to facilitate precision alignment with the pick-up head array 104. For example, the carrier stage 116 and/or target stage 120 may include three degrees of freedom. The degrees of freedom may include left and right, backward and forward, and a yaw rotational degree of freedom. The carrier substrate 114 is moved with the carrier stage 116, and the display substrate 118 is moved with the target stage 120.

The system 100 may include one or more carrier substrates 114. For example, different carrier substrates 114 may carry different color LED dies. A carrier substrate 114 may be carrier film that holds singulated semiconductor devices 112 for transfer to the display substrate 118. The system may include one or more target substrates 118. In some embodiments, such as when the target substrate 118 is the display substrate for receiving the semiconductor devices 112, the target stage 120 includes a heater for thermal conductive bonding of the electrical contact pads of the semiconductor devices 112 to the display substrate 118 subsequent to placement of the semiconductor devices 112 on the display substrate 118 by the pick-up head 104. In other embodiments, the target substrate 118 is an intermediate carrier substrate that is used to facilitate direct bonding of the semiconductor devices 112 with a separate display substrate 118 (e.g., using a direct bonding process rather than fluidic material transfer).

In some embodiments, the system 100 includes up/down inspection cameras. Alternatively, for the higher accuracy, the pick-up head array 104 may be mounted to a modified wafer aligner. For nano-placement accuracy a smaller working/movement distance would be advantageous. In some embodiments, the pick-up head array 104 provides a massively parallel pick and place operation, reducing the time for assembly and therefore reducing manufacturing costs.

In some embodiments, the system 100 includes multiple pick-up head arrays 104 each positioned at a separate station. Each station may be dedicated to the pick and place of a particular color LED, such as a green station for green LEDs, a red station for red LEDs, and a blue station for blue LEDs, etc.

The laser 126 generates a laser beam to singulate the semiconductor devices 112 on the carrier substrate 114. Multiple semiconductor devices 112 may be fabricated on a native substrate and singulated on the carrier substrate 114. In some embodiments, the laser beam is directed through the carrier substrate 114. The carrier substrate may include a carrier tape or other adhesive layer to hold the semiconductor devices 112 in place with an adhesion force. The laser beam reduces the adhesion force to facilitate pick up of the semiconductor devices 112 by the pick-up head array 104. In some embodiments, the system 100 includes a mechanical dicer to singulate the semiconductor devices 112, such as a diamond based cutting wheel.

FIG. 2 is a schematic diagram illustrating a pick-up head array 104 of the display assembly system 100, in accordance with one embodiment. The pick-up head array 104 includes a plurality of pick-up heads 124. Each pick-up head 124 is connected with the fluidic material holder 110 via a fluidic manifold 214 to receive fluidic material from the fluidic material holder 110. The fluidic material serves as a transfer medium for picking and placing of the semiconductor devices 112.

Figure 5E:
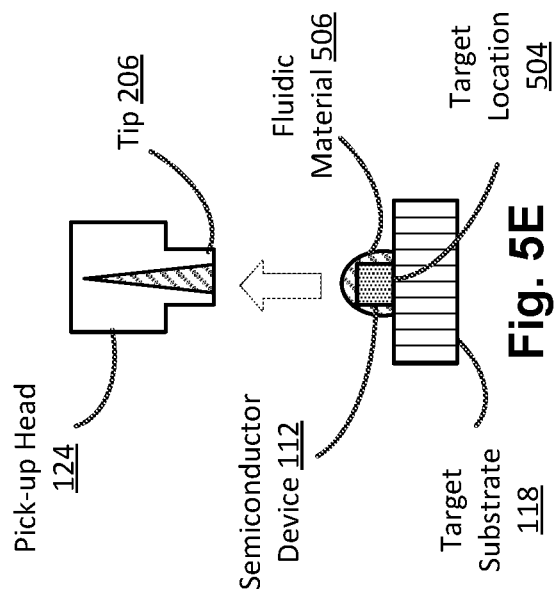

Each pick-up head 124 may include a housing 202 defining a fluid channel 204 to carry the fluidic material. The housing 202 further defines a tip 206 of the pick-up head 124. The tip 206 includes a fluidic aperture 208 that dispenses the fluidic material from the fluid channel 204. The fluidic material is released at the tip 206 to form the fluidic membrane (e.g., as shown in FIG. 5B) on the tip 206. The fluidic membrane provides an attractive force for picking up a semiconductor device 112.

The pick-up head 124 releases controlled amounts of the fluidic material. For example, the pick-up head 124 releases a first amount of fluidic material to form the fluidic membrane on the tip 206 to pick up a semiconductor device 112, and a second amount of fluidic material to separate the semiconductor device 112 from the pick-up head 124 for placement on the target substrate 118. To that end, the pick-up head 124 may include a dispense membrane 216, a piezoelectric transducer 210, and pick-up head control circuitry 212.

The pick-up head control circuitry 212 is coupled to the controller 106 and the piezoelectric transducer 210. The piezoelectric transducer 210 is paired to a flexible dispense membrane 216, such as through an adhesive bonding or other technique. Based on instructions from the controller 106, the pick-up head control circuitry 212 provides a voltage to the piezoelectric transducer 210 that causes the piezoelectric transducer 210 to enter a deformed state. The piezoelectric transducer 210 contracts in the deformed state, pulling the dispense membrane 216 away from the fluidic channel 204 (e.g., in an upwards direction with reference to FIG. 2) and creating a low pressure condition in the fluidic channel 204. The low pressure condition in the fluidic channel 204 causes the fluidic material from the fluidic material holder 110 to be drawn into the fluidic channel 204 via the fluidic manifold 214. After the fluidic material is drawn into the fluidic channel 204, the pick-up head control circuitry 212 causes the piezoelectric transducer to return to a rest state by discontinuing the voltage application. The piezoelectric transducer 210 expands from the deformed state, pushing the dispense membrane 216 toward the fluidic channel 204 and creating a high pressure region in the fluidic channel 204. The high pressure region causes fluidic material drawn into the fluidic channel 204 to be released from the fluidic aperture 208.

In some embodiments, the amount of fluidic material that is released is controlled based on the voltage level applied to the piezoelectric transducer 210. A higher voltage can cause greater contraction of the piezoelectric transducer 210, and thus a larger amount of fluidic material release. In contrast, a lower voltage can be used for a smaller amount of fluidic material release.

In some embodiments, the release of fluidic material from the pick-up heads 124 is not limited to the use of a piezoelectric transducer, and can be controlled by in other ways. For example, the release of fluidic material can be controlled by heating of the fluid material in the fluid channel 204 causing expansion and resulting in ejection, ultrasonic agitation, physical extension of a Micro-Electro-Mechanical Systems (MEMs) "piston," or an excitation process that activates the dispense membrane 216.

The fluidic material may include a covalent chemistry that assists in the attractive force used to overcome any retention force of the semiconductor device 112 to be picked up from the carrier substrate 114. The retention force may include the weight of the semiconductor device 112, and in some embodiments, may further include an adhesion force that bonds the semiconductor device 112 to the carrier substrate 114. The semiconductor device 112 to be transferred is held to the pick-up head 124 by surface tension (or other attractive forces associated with the fluidic material such as covalent or van der waal bond forces). For example, the fluid material may include an active covalent bond element that can be deactivated. In some embodiments, the semiconductor device 112 is treated to include a hydrophilic surface. The hydrophilic surface can be produced in a pre-activation using a chemical and/or physical alteration (e.g., plasma pre-treatment to deposit a hydrophilic material on the surface(s) that contacts the fluidic membrane).

The first and second amounts of fluidic material released by a pick-up head 124 may be deposited onto the target substrate 118 in connection with placement of the semiconductor device 112 on the target substrate 118. The fluidic material may evaporate and serve only as a semiconductor device transfer medium. Alternatively, such as when the target substrate 118 is the display substrate, the fluidic material may form an encapsulating layer or structure that fully or at least partially covers the semiconductor device 112 on the target substrate 118. The encapsulating layer can facilitate the manufacture of the display, or modify the functioning of the display, such as depending on the properties of the fluidic material.

One or more types of fluidic material may be used in the pick-up head array 104. For example, the fluidic material may include a low boiling point liquid, a high viscosity polymer, a flux compound (e.g., used to print on the receiving substrate prior to start of transfer), a color converting material (e.g., used to convert the color of light emitted from the semiconductor device 112), and/or a conductive material (e.g., used to form electrical connection between the semiconductor device 112 and the target substrate 118).

In some embodiments, the fluidic material includes conductive particles. After drying, the conductive particles are attracted to the metal contact pads (e.g., depending on device orientation) of the semiconductor device 112 to form electrical contacts between the semiconductor device 112 and the target substrate 118. In some embodiments, the fluidic material may include a color conversion material to assist in the manufacture of a multi-color (e.g., red, green, and blue (RGB)) display. The fluidic material may include constituents of a Nano phosphor ink, Quantum Dots, or other color conversion material.

In some embodiments, the semiconductor devices 112 placed onto a target substrate 118 are of a single color, such as blue LEDs that emit light having blue wavelengths. Different pick-up heads 124 of the pick-up head array 104 may (e.g., simultaneously) release different color conversion materials. The color conversion materials encapsulate the semiconductor devices 112 to produce light having other colors, such as by converting the emitted blue wavelengths into red or green wavelengths. The system 100 may include multiple fluidic material holders 110 that hold different fluidic materials, and that are connected with different subsets of pick-up heads 124 of the pick-up head array 104. In other embodiments, different pick and place cycles of the pick-up head array 104 may use different color conversion material to place LEDs of different color in separate cycles. The system 100 may include multiple pick-up head arrays 104 connected to different fluidic material holders 110.

In some embodiments, the fluidic material includes an epoxy binder that can be thermally and/or UV cured (e.g., tacked) containing a color conversion material. For semiconductor devices that to retain blue light emission (e.g., without color conversion) the color conversion material is omitted from the epoxy binder. The epoxy binder may encapsulate such semiconductor devices to form a protective, non-color concerting layer. In other embodiments, a color conversion material is deposited onto the encapsulating layer formed by the fluidic material transfer medium subsequent to device placement.

In some embodiments, the pick-up head 124 is designed to the specific size of the semiconductor device to be picked up. Alternatively, the pick-up head 124 could be manufactured using a scaled separation distance based on the unit size of the semiconductor device to be picked up. The aperture 214 of the pick-up head 124 may be designed to match the physical area of the emitter electrode of the semiconductor device. The pick-up head 124 may be designed to be centralized on the center of the semiconductor device based on electrode shape, and positioned using a matched position look down camera. In some embodiments, minimum feature size of the aperture 214 of the pick-up head 124 may be 10 μm or smaller to pick up small semiconductor devices such as micro-LEDs.

Figure 3B:
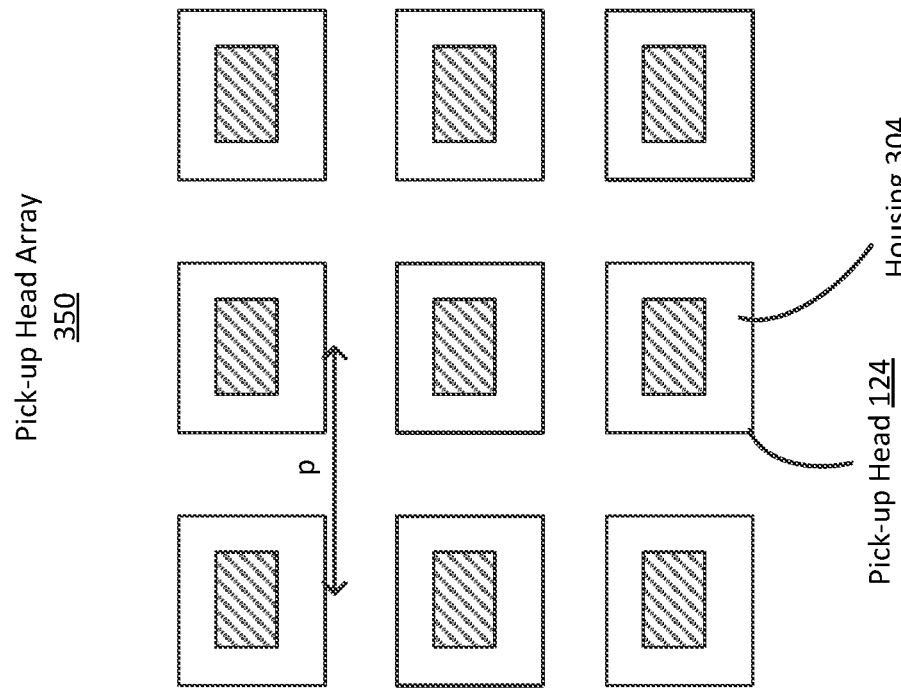
FIG. 3B is a schematic diagram illustrating a pick-up head array including individual pick-up heads, in accordance with one embodiment.
Figure 3A:
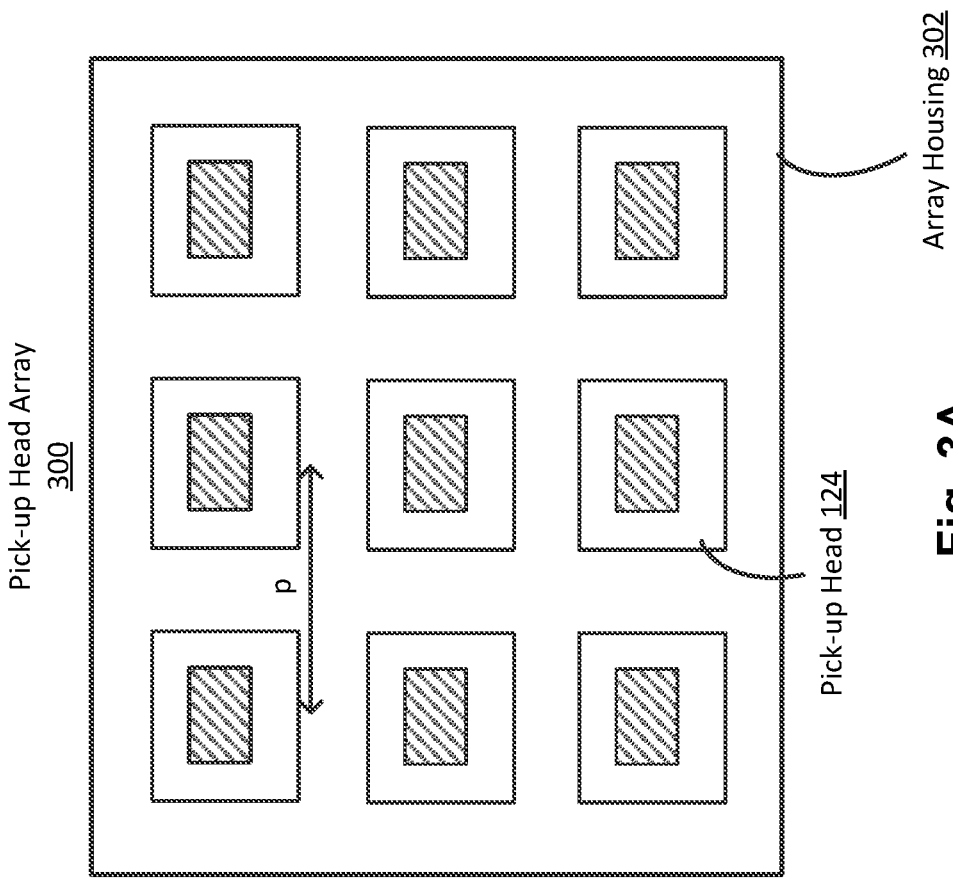
FIG. 3A is a schematic diagram illustrating a pick-up head array including integrated pick-up heads, in accordance with one embodiment.

FIG. 3A is a schematic diagram illustrating a pick-up head array 300 including integrated pick-up heads 124, in accordance with one embodiment. From the bottom view shown in FIG. 3A, the pick-up head array 300 includes a single array housing 302 that defines an aligned array of pick-up heads 124. In some embodiments, the pick-up head array 300 includes N×N pick-up heads 124, where N=1 or more. Each of the pick-up heads 124 move together with the array housing 302 to pick and place semiconductor devices 112.

FIG. 3B is a schematic diagram illustrating a pick-up head array 350 including individual pick-up heads 124, in accordance with one embodiment. Unlike the pick-up head array 300 having a single integrated array housing 302, the pick-up head array 350 includes individual pick-up heads 124 that can be moved on an individual basis to pick and place semiconductor devices 112. In one example, the pick-up heads 124 of the pick-up head array 350 move left and right, and forward and backward together to preserve an aligned array, but can be moved up and down (e.g., toward and away from substrates) on an individual basis for pick and place operations. Rather than the integrated array housing 302, each individual pick-up head 124 of the pick-up head array 350 may include a separate housing 304.

In some embodiments, adjacent pick-up heads 124 are separated by a pitch P to facilitate parallel placement of multiple semiconductor devices 112 in accordance with a desired array alignment. In some embodiments, the separation between adjacent pick-up heads 124 of the pick-up head array 300 or 350 may be adjustable.

In some embodiments, the pick-up head array 104 is fabricated using micro machining or micro molding of constituent parts that are subsequently combined together. An example of the material type to be micro machined may include, but is not limited to, silicon or silicon dioxide. Micro molding of parts could be achieved from metallic or polymeric materials using lithographic and/or plating processes.

FIG. 4 is a flowchart illustrating a process 400 for picking and placing a semiconductor device 112 with a pick-up head 124, in accordance with one embodiment. Process 400 can be performed by the system 100 to transfer a semiconductor device, such as a micro-LED, from a carrier substrate 114 to a target substrate 118. Process 400 is discussed with reference to FIGS. 5A, 5B, 5C, 5D and 5E, showing schematic diagrams illustrating the picking and placing of the semiconductor device with the pick-up head, in accordance with one embodiment. In some embodiments, the carrier substrate 114 is a carrier film and the target substrate is an intermediate carrier substrate that facilitates placement of semiconductor devices 112 to a target display substrate. In other embodiments, the target substrate 118 is the display substrate, or other final substrate to which the semiconductor devices 112 are placed and bonded.

A pick-up head 124 releases 410 a first amount of fluidic material from a tip 206 of the pick-up head 124 to form a fluidic membrane on the tip 206. For example, the pick-up head control circuitry 212 applies a voltage to the piezoelectric transducer 210 to cause the piezoelectric transducer 210 to contract, transitioning from a rest state to the deformed state. The deformation of the piezoelectric transducer 210 pulls the dispense membrane 216 away from the fluidic channel 204, resulting in a low pressure condition in the fluidic channel 204 that draws the first amount of fluidic material from the fluidic material holder 110 into the fluidic channel 204. The pick-up head control circuitry 212 stops application of the voltage to cause the piezoelectric transducer 210 to expand and return to the rest state. The piezoelectric transducer 210 pushes the dispense membrane 216 toward the fluidic channel 204, resulting in a high pressure condition in the fluidic channel 204 that releases the first amount of fluidic material from the tip 206 of the pick-up head 124 to form the fluidic membrane on the tip 206.

The fluidic membrane on the tip 206 of the pick-up head 124 is brought 420 in contact with a semiconductor device 112 on a carrier substrate 114 to attach the semiconductor device 112 to the fluidic membrane. The fluidic membrane provides a surface tension or attractive force to pick up the semiconductor device 122 from the carrier substrate 114.

With reference to FIG. 5A, the tip 206 of the pick-up head 124 is aligned with the semiconductor device 112 on the carrier substrate 114 using the SEM 108. Aligning a pick-up head 124 or pick-up head array 104 with semiconductor device may include manipulating the position of the pick-up head 124 (e.g., movement left or right, and forward or backward) and/or manipulating the position of a stage (e.g., moving the carrier stage 116 or the target stage 120 left or right, backward or forward, or along yaw rotational degree of freedom). After alignment, the pick-up head 124 is lowered toward the semiconductor device 112 to be in proximity with the semiconductor device 112 without contacting the semiconductor device 112.

With reference to FIG. 5B, the first amount of fluidic material is released from the tip 206 of the pick-up head 124 to form the fluidic membrane 502 that contacts the semiconductor device 112. The semiconductor device 112, which is hydrophilic, attaches to the fluidic membrane 502. By contacting the semiconductor device 112 with the fluidic membrane 502 rather than a part of the pick-up head 124 or other mechanical component, the semiconductor device 112 and carrier substrate 114 are less likely to be damaged during pick up of the semiconductor device 112.

In FIGS. 5A and 5B, the fluidic membrane 502 is formed after the pick-up head 124 has been brought in proximity with the semiconductor device 112. In another example, the fluidic membrane 502 is formed, and then the pick-up head 124 is brought in proximity with the semiconductor device 112 to contact the semiconductor device 112 with the fluidic membrane 502. In some embodiments, the pick-up head array 104 is brought into contact with the semiconductor devices 112 on the carrier substrate 114 to pick up the semiconductor devices 112.

Returning to FIG. 4, the semiconductor device 112 is removed 430 from the carrier substrate 114 by lifting the pick-up head 124 with the semiconductor device 112 attached to the fluidic membrane 502 on the tip 206 of the pick-up head 124. With reference to FIG. 5C, the pick-up head 124 having the semiconductor device 112 may be lifted away from the carrier substrate 114, and toward the target substrate 118.

The pick-up head 124 releases 440 a second amount of the fluidic material from the tip 206 of the pick-up head 124 to separate the semiconductor device 112 from the pick-up head 124 and place the semiconductor device 112 at a location on a target substrate 118.

Figure 5D:
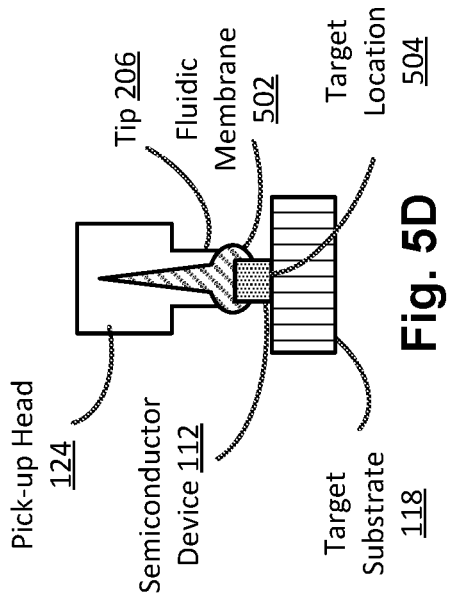

With reference to FIG. 5D, the semiconductor device 112 is aligned with a target location 504 on the target substrate 118 using the pick-up head 124. The SEM 108 may be used to facilitate the alignment. The pick-up head 124 may be brought toward the target substrate such that the semiconductor device 112 attached to the fluidic membrane 502 is placed at the target location 504. In some embodiments, the movement of the pick-up head 124 is controlled such that the pick-up head does not contact the semiconductor device 112 during the placement. By not contacting the semiconductor device 112 with the tip 206 of the pick-up head 124, the semiconductor device 112 and target substrate 118 are less likely to be damaged during placement of the semiconductor device 112.

With reference to FIG. 5D, the pick-up head 124 releases the second amount of fluidic material to separate the semiconductor device 112 from the pick-up head 124 and place the semiconductor device 112 at a target location 504 on a target substrate 118. The pick-up head 124 may be lifted away from the target substrate 118 subsequent to placement of the semiconductor device 112. Releasing the second amount of fluidic material from the pick-up head 124 may cause the first and second amounts of fluidic material to cover at least a portion of the semiconductor device 112 when the semiconductor device 112 is placed at the target location 504 of the target substrate 118, as shown by fluidic material 506.

In some embodiments, the target substrate 118 includes hydrophilic and hydrophobic regions that hold the placed semiconductor devices 122 on the target substrate 118 via an encapsulating layer formed from the fluidic material. For example, the target locations 504 may be hydrophilic regions and non-target locations of the target substrate 118 may be hydrophobic regions. The fluidic material that encapsulates the semiconductor device 112 is attracted to a hydrophilic target location 504, and thus facilitates placement of the semiconductor devices 112 at the target location 504.

After placement of the semiconductor devices 112, a bonding process may be performed. The bonding processes attaches the semiconductor devices 112 to the target substrate 118, and may also be used to form the electronical contacts between the semiconductor devices 112 and the target substrate 118. The bonding process may include reflow of a low temperature solder alloy between the semiconductor devices 122 and the target substrate 118 such as tin-silver (SnAg) or copper-tin (CuSn). In some embodiments, the hydrophilic nature of the semiconductor devices 112 being transferred may be reversed to assist in the deposition, ejection, or printing process of the semiconductor devices 112 to the target substrate 118. For example, a pre-activation may be performed to deposit a material switches between hydrophilic and hydrophobic states, such as a transition-metal oxide (e.g., $TiO_2$, ZnO, F—$TiO_2$, etc.).

The material can be in the hydrophilic state when deposited on the semiconductor device for pick up using the fluidic membrane, and then transitioned to the hydrophobic state in the course of placement of the semiconductor device. For example, the material may be transitioned from the hydrophobic state to the hydrophilic state by band-gap photoexitation (e.g., using ultraviolet (UV) radiation) that causes formation of —OH on the surface of the material (e.g., $TiO_2$ particle), and transitioned from the hydrophilic state to the hydrophobic state by dark storage that causes replacement of the —OH by atmospheric oxygen. The process 400 as illustrated in FIG. 4 is merely illustrative and various changes can be made to the process. For example, the semiconductor devices picked up at 410 can be placed 440 on the target substrate by the pick-up head 124 in ways other than releasing the second amount of fluidic material, such as by bringing the pick-up head 124 toward a hydrophilic target location 504 until the fluidic membrane (and thus the attached semiconductor device 112) is attracted to the target location 504.

Figure 6:
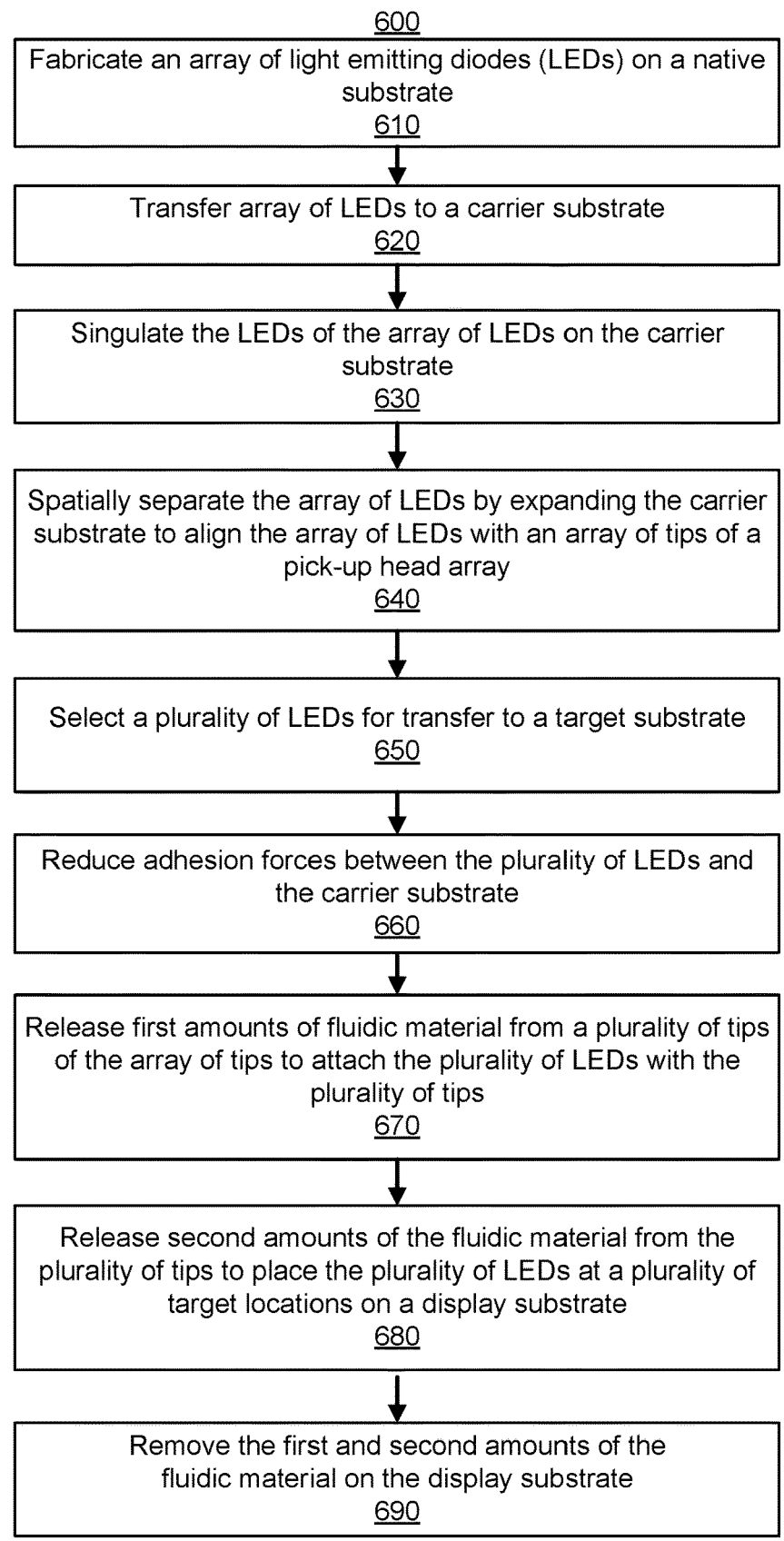
FIG. 6 is a flowchart illustrating a process for manufacturing a display device using a pick-up head array, in accordance with one embodiment.

FIG. 6 is a flowchart illustrating a process 600 for manufacturing a display device with a pick-up head array 104, in accordance with one embodiment. Process 600 can be performed by the system 100 to manufacture a display having a display substrate and LEDs coupled to the display substrate. In this example, the carrier substrate 114 is a carrier film, and the target substrate 118 is the display substrate. The semiconductor devices 112 are LEDs that are placed on the display substrate to form pixels. A pixel may include sub-pixels of individual different color LEDs. Process 600 is discussed with reference to FIGS. 7A, 7B, 7C, 7D, 7E, 7F, and 7G showing schematic diagrams illustrating the manufacturing a display device with the pick-up head array 104, in accordance with one embodiment.

An array of LEDs are fabricated 610 on a native substrate. The LEDs may include micro-LEDs. In some embodiments, the array of LEDs on the native substrate are fabricated such that they have a common structure and emit light of a common color. To assemble a display, multiple arrays of LEDs of different color (e.g., red, green, and blue) may be fabricated on separate native substrates. In another example, if the transfer medium of the pick-up head array 104 includes a color conversion material, then an array of a single color LED (e.g., blue) may be fabricated on one or more native substrates.

Figure 7A:
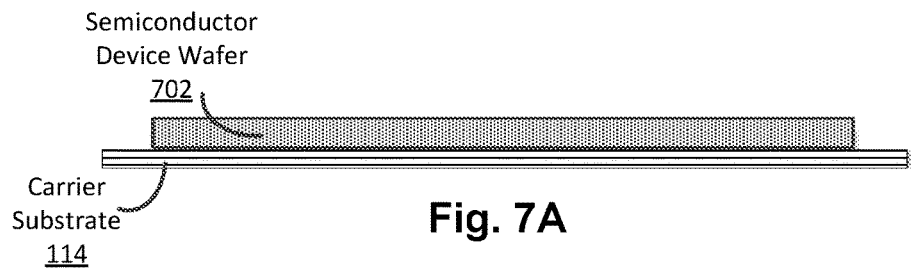
FIGS. 7A, 7B, 7C, 7D, 7E, 7F, and 7G are schematic diagrams illustrating the picking and placing of multiple semiconductor devices using pick-up head array, in accordance with one embodiment.

After fabrication, the array of LEDs of the native substrate are transferred 612 to a carrier substrate 114. With reference to FIG. 7A, the semiconductor device wafer 702 includes an array of LEDs fabricated on the native substrate. The semiconductor device wafer 702 is placed on the carrier substrate 114, here a carrier film, to transfer the LEDs to the carrier substrate 114. In some embodiments, the carrier substrate 114 provides an adhesion force that bonds the semiconductor device wafer 702 to the carrier substrate 114.

Figure 7B:
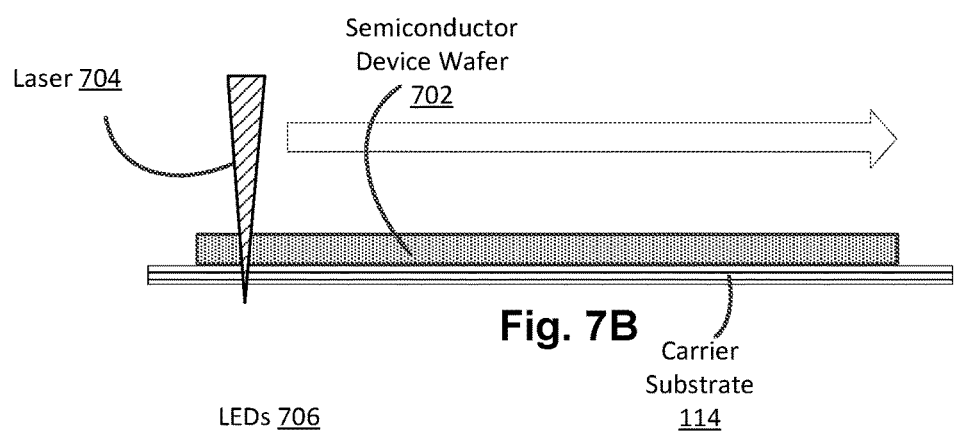

The LEDs of the array of LEDs are singulated 630 on the carrier substrate 114. Singulating the LEDs may include using a mechanical dicing process or a laser dicing process, such as an ablation dicing or stealth dicing process. The singulation separates the array of LEDs into individual LEDs that can be picked and placed onto the display substrate. With reference to FIG. 7B, the laser 704 is applied between LEDs across the semiconductor device wafer 702 to define individual LEDs. In some embodiments, the laser 704 is applied to the semiconductor devices wafer 702 through the carrier substrate 114.

Figure 7C:
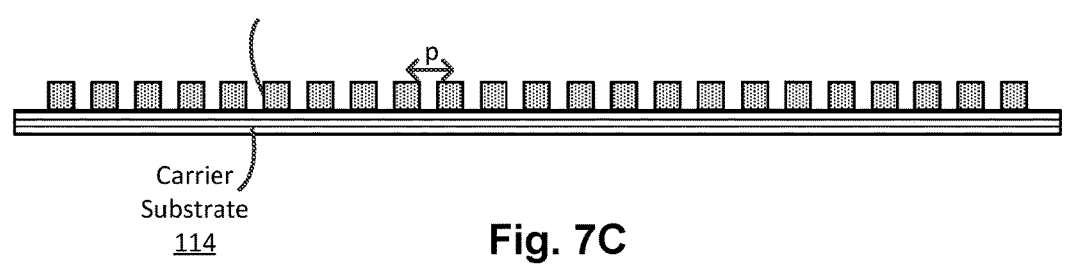

The array of LEDs are spatially separated 940 by expanding the carrier substrate 114 to align the array of LEDs with an array of tips 206 of pick-up heads 124 of the pick-up head array 104. With reference to FIG. 7C, the carrier substrate 114 may be a carrier film capable of expanding. The amount of expansion is controlled such that the distance between adjacent LEDs 706 of the array are separated by a pitch P equal to the distance between adjacent pick-up heads 124 of the pick-up head array 104. Thus, expansion of the carrier substrate 114 prepares the array of LEDs 706 for efficient parallel pick up by the pick-up head array 104. Alternatively or additionally, the pick-up heads 124 of the pick-up head array 104 may be adjusted to conform to the pitch P of the LEDs on the carrier substrate 114.

In some embodiments, the LEDs are spatially separated in connection with the singulation. For example, stealth dicing may be performed using controlled wafer expansion to separate LEDs along dicing lines formed by a laser focused through an objective lens. In contrast, little or no wafer expansion can be used during mechanical dicing because of the controlled die separation caused by removal of material from the kerf (e.g., formed by a diamond based cutting wheel).

Returning to FIG. 6, a plurality of LEDs are selected 650 for transfer to the target substrate 118. For example, a group of LEDs may be selected for transfer to the display substrate to form sub-pixels for multiple pixels of the display. In some embodiments, the controller 106 selects one or more LEDs for transfer using the pick-up head array 104.

The pick-up head array 104 may access the one or more LEDs at any location of the carrier substrate. In some embodiments, a pre-program sequence could be used, alternatively an electronic wafer map may be stored and used by the controller 106. Depending on the selected pick-up heads 124, multiple semiconductor devices may be transferred concurrently in a variety of patterns (e.g. strips, wide spaced arrays, close packed arrays, etc.). In some embodiments, the plurality of semiconductor devices are selected from multiple sources, and then placed on the target substrate in a particular pattern. In some embodiments, the plurality of selected LEDs include functional die, and non-functional die are not selected for transfer. The functional die may be determined based on testing the semiconductor devices prior to the transfer.

The devices could be picked from one wafer source of from multiple wafer sources that could be closed packed on the final receiving substrate. Any and all functional die from the wafer surface could be harvested.

An adhesion force between the plurality of selected LEDs and the carrier substrate 114 is reduced 660. As discussed above, the carrier substrate 114 may include a carrier tape. The carrier tape may be an adhesive layer that holds the individual LEDs in place subsequent to singulation. The adhesion force applied to the LEDs by the carrier substrate 114 may be reduced using a pre-release process to facilitate pick up with the pick-up head.

The pre-release process may include localized heating with a laser beam point beneath the semiconductor devices before the fluidic membranes on the pick-up head array 104 are brought into contact with semiconductor devices. Multiple semiconductor devices can be accurately targeted using a calibrated diffraction element to target multiple locations, either linearly or in an ordered array. In some embodiments, the carrier substrate is cooled prior to start of the subsequent device pick-up. In some embodiments, a minimum beam size in the order of a few to 10's of μms can be used in the pre-release process, where the focal point is at the interface between the semiconductor device and the carrier tape. In some embodiments, the carrier tape, that would for example be transparent to the activation wavelength of the dicing laser 704, could have an adhesive layer that preferentially absorbs the laser energy, enabling a reduction in the tack of the tape in a localized area. In some embodiments, the carrier tape absorbs the laser 704 applied through the carrier tape during the laser dicing process at 630 to cause a reduction in the adhesive force or tack of the adhesive layer in localized areas.

Identification of semiconductor device(s) to be pre-released from the carrier tape or substrate prior to pick up may be performed using an indexed reverse look-up camera (e.g., SEM 108) with reference points within substrate material and an electronic wafer map. As such, the system 100 tracks semiconductor devices have already been transferred from a carrier substrate, as tracks target substrates that have been populated with the semiconductor devices.

The semiconductor device may be placed within a defined spatial pattern that may include fixed separation distances (e.g., the pitch P) or a close packing order. The spatial pattern may depend the features and pixel count of the display substrate. Semiconductor devices can be picked from one or more carrier substrates to generate the final assembly on the display substrate. These semiconductor devices may be fabricated from separate (e.g., red, green and blue) native substrates, and placed on the display substrate according to the spatial pattern. The spatial pattern may be achieved using alignment techniques, such as mask aligners used during photolithographic processing of semiconductor wafers.

A plurality of tips 206 of the pick-head array 104 each releases 670 first amounts of fluidic material to attach the plurality of LEDs with the plurality of tips 206. The plurality of tips 206 may be selected from an array of tips 206 of the pick-up heads 124 of the pick-up head array 104. The first amounts of fluidic material causes the fluidic membrane to form on each of the plurality of tips 206 to pick up the plurality of selected LEDs from the carrier substrate 114.

Figure 7D:
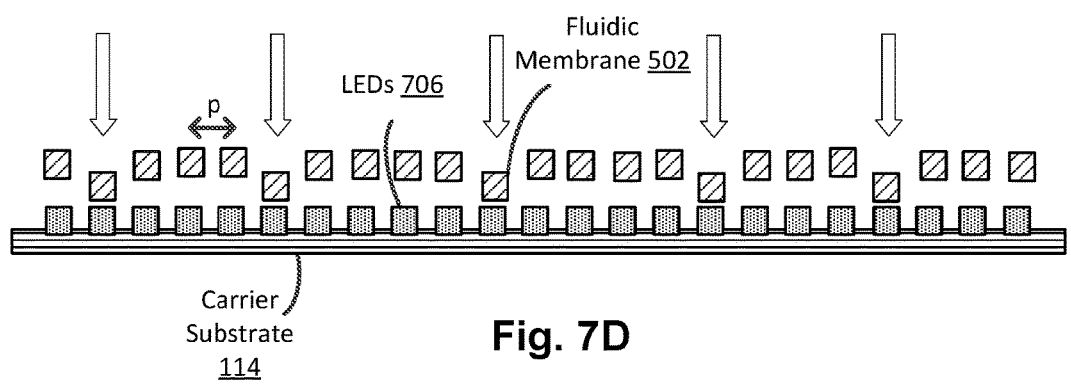

In some embodiments, fluidic material is released only from a subset of selected tips 206 of the pick-up head array 104. One or more pick-up heads 124 may be non-selected such that they do not release fluidic material, and thus do not pick up any LED from the carrier substrate 114. With reference to FIG. 7D, the selected pick-up heads 124 are separated by the pitch P, and brought toward the LEDs 706 to pick up the LEDs 706 separated by the pitch P from the carrier substrate 114 using the fluidic membranes 502.

Returning to FIG. 6, the plurality of tips 206 of the pick-up head array 104 each releases 680 second amounts of the fluidic material to place the plurality of LEDs at a plurality of target locations on the target substrate 118, which in this example is the display substrate. The target locations are locations of sub-pixels for multiple pixels of the display. The discussion of process 400 of FIG. 4 may be applicable at 670 and 680 of process 600.

Figure 7E:
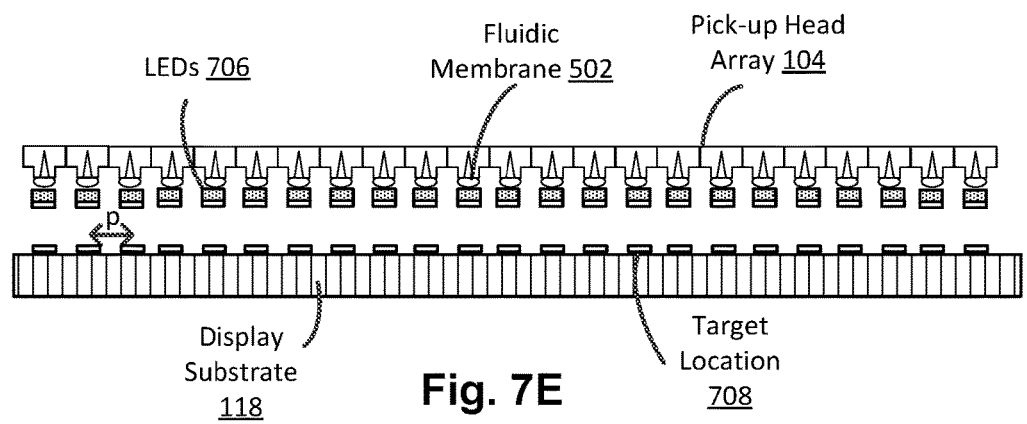

With reference to FIG. 7E, the pick-up head array 104 carries the LEDs 706 attached to the fluidic membranes 502 to the display substrate 118 for placement at target locations 708 of the display substrate 118. In some embodiments, the target locations 708 include contact pads separated by the pitch P which form electrical contacts with contact pads on the LEDs 706. In other embodiments, the distance between the target locations 708 of the display substrate 118 may be different from the pitch P, and the pick-up array 104 adjusts the space between adjacent pick-up heads 124 according to the distance between the target locations 708.

Figure 7F:
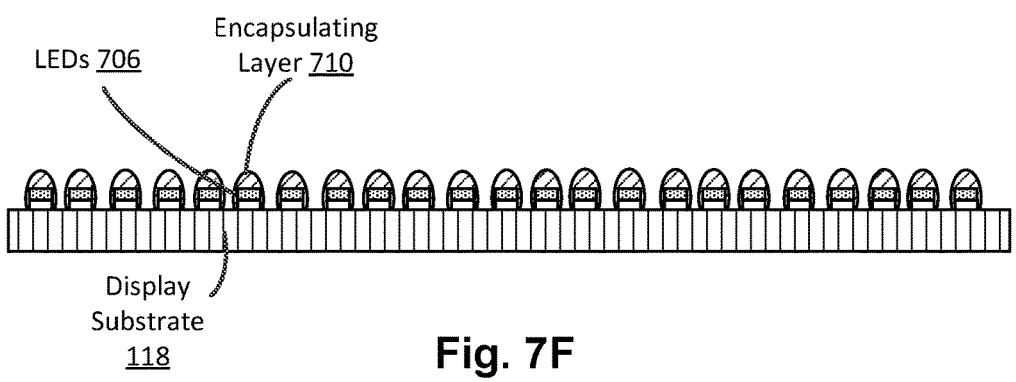

With reference to FIG. 7F, the pick-up head array 104 is separated from the display substrate 118 to place the LEDs

706 on the display substrate 118. The first and second amounts of fluidic material from an encapsulating layer 710 on each of the LEDs 706 transferred to the display substrate 118.

Figure 7G:
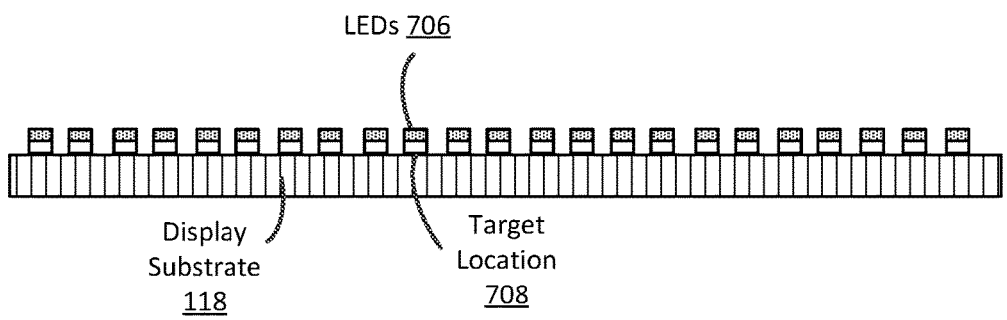

Returning to FIG. 6, the first and second amounts of the fluidic material are removed 690 from the display substrate 118. For example, the fluidic material may include a low boiling point liquid or other fluid that evaporates on the target substrate. With reference to FIG. 7G, the LEDs 706 are placed at the target locations 708 of the display substrate 118 and the encapsulating layer 710 has evaporated. The fluidic material serves as the transfer medium for the LEDs 706, and does not remain on the display substrate 118 subsequent to transfer of the LEDs 706. In some embodiments, the fluidic material is evaporated in connection with a bonding process where the semiconductor devices 112 are bonded to the target substrate 118 using a low temperature solder alloy.

In some embodiments, at least some components of the fluidic material does not evaporate and forms a functional encapsulating layer for the plurality of LEDs. The encapsulating layer may structurally protect the LEDs, form electrical connections between the LEDs and the display substrate, modify the emission wavelength of the LEDs (e.g., a color conversion layer), and/or reduce the intensity of the light (e.g., an attenuating layer). For example, the fluidic material may be selected based on desired properties of the encapsulating layer, and may include a high viscosity polymer, a flux, a color converting material, a light attenuating material, and/or a conductive material. In some embodiments, different pick-up heads 124 may use different fluidic material, such as different color converting material to generate different sub-pixel types.

The process 600 as illustrated in FIG. 6 is merely illustrative and various changes can be made to the process. For example, the plurality of LEDs picked up at 670 may be placed on a plurality of different target substrates 118 at 680, rather than a single target substrate 118. In another example, process 800 can be repeated for different native substrates, where each native substrate has LEDs of different color. In each pick and place cycle, sub-pixels associated with a particular may be placed on the display substrate, and multiple pick and place cycles with different types of LEDs can be used to manufacture each pixel of the display.

Figure 9A:
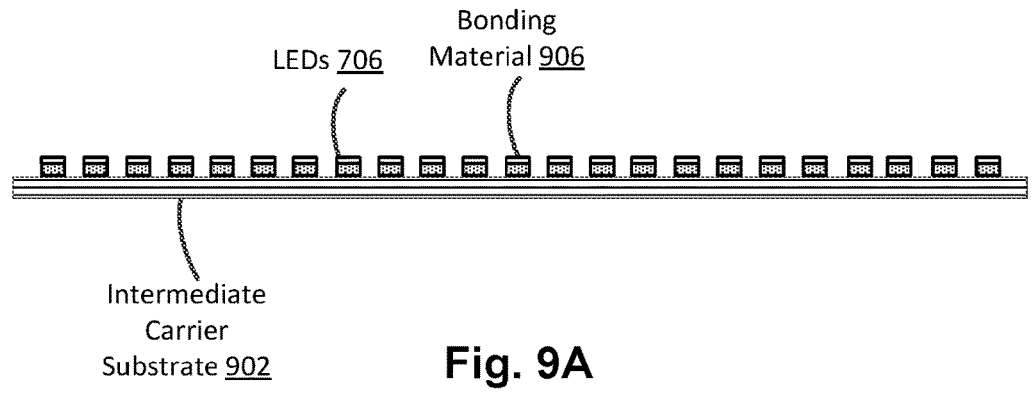
FIGS. 9A, 9B, and 9C are schematic diagrams illustrating the picking and placing of multiple semiconductor devices using a pick-up head array and an intermediate carrier substrate, in accordance with one embodiment.
Figure 9B:
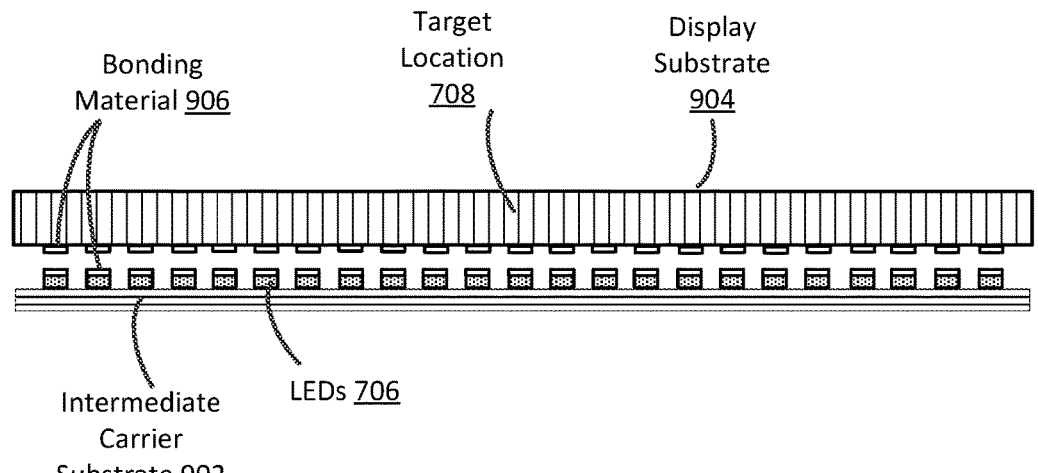
Figure 9C:
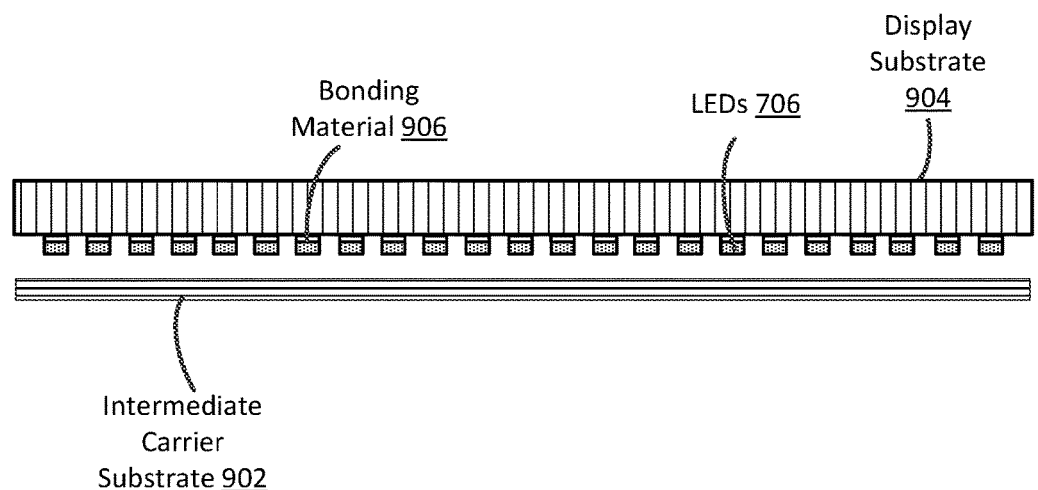

FIG. 8 is a flowchart illustrating a process 800 for manufacturing a display device with a pick-up head array 104 and an intermediate carrier substrate, in accordance with one embodiment. Rather than placing the LEDs directly on the target substrate, the pick-up head array 104 transfers one or more LEDs from a carrier tape to an intermediate carrier substrate, and then the LEDs on the intermediate carrier substrate are transferred to the display substrate 118 using a direct bonding process. Process 800 is discussed with reference to FIGS. 9A, 9B, and 9C showing schematic diagrams illustrating the manufacturing the display device with the pick-up head array 104 and an intermediate carrier substrate 902, in accordance with one embodiment.

A plurality of tips 206 of the pick-head array 104 each releases 810 first amounts of fluidic material to attach a plurality of LEDs with the plurality of tips 206. After pick-up, the plurality of tips 206 of the pick-up head array 104 each releases 820 second amounts of the fluidic material to place the plurality of LEDs at a plurality of target locations on the intermediate carrier substrate. The discussion at 670 and 680 of process 600 may be applicable at 810 and 820, except that the LEDs are transferred to a target substrate that is an intermediate carrier substrate rather than to the display substrate. With reference to FIG. 9A, the pick-up array 104 places LEDs 705 on the intermediate carrier substrate 902 using the fluidic material as the transfer medium.

Returning to FIG. 8, the target locations of a display substrate are aligned 830 with the plurality of LEDs on the intermediate carrier substrate. Unlike a carrier tape, the intermediate carrier substrate may be a semiconductor substrate that does not expand to facilitate direct binding in accordance with the alignment. With reference to FIG. 9B, the target locations 708 of the display substrate 904 are aligned with the LEDs 706 on the intermediate carrier substrate 902.

Returning to FIG. 8, the plurality of LEDs are transferred to the display substrate from the intermediate carrier substrate using a direct bonding process. In direct bonding, a bonding material 906 is placed on the LEDs 706 and/or the target locations 708, and then the LEDs 706 and the target locations are brought into contact to bond the LEDs 706 to the display substrate 118. With reference to FIG. 9C, the LEDs 706 are placed on the display substrate 904, the bonding material 906 attaches the LEDs 706 to the display substrate 904, and the intermediate carrier substrate 902 is separated from the LEDs 706.

Figure 10:
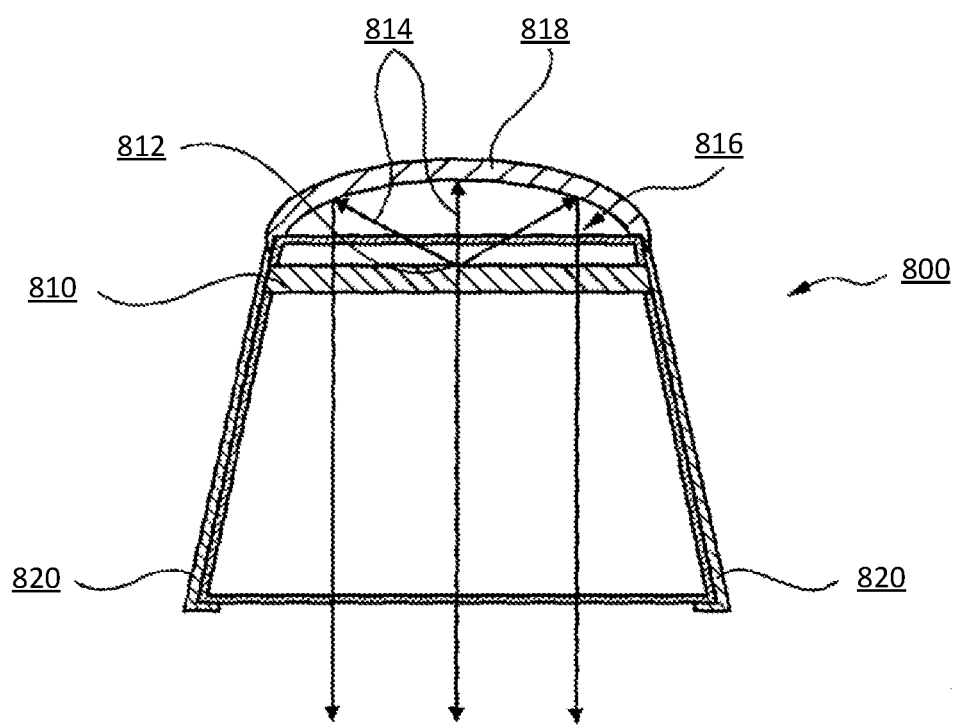
FIG. 10 is a schematic diagram illustrating a micro-LED, in accordance with one embodiment.

FIG. 10 is a schematic diagram of a micro-LED 1000, in accordance with one embodiment. The micro-LED 1000 is an example of a semiconductor device 112 that can be picked and placed with the pick-up head array 104. The micro-LED 1000 has a quantum well region 1010 from which light 1014 is emitted from a point source 1012. The quantum well region 1010 may be about 100 nm thick and may be made from indium gallium nitride (InGaN). Emitted light rays 1014 are shown passing through a transparent dome cross-sectioned cap 1016. The dome cross-section cap 1018 is integrally formed with the rest of the LED structure during fabrication. The micro-LED 1000 may include a single isolated p-n diode or may include multiple structures with a common p and/or n connections. The light 1014 is shown being reflected from a metal contact/curved mirror 1018 back into the main body of the micro-LED 1000. The micro-LED 1000 is also shown to have oxide covered side walls 1020. The transparent cap 1016 may in some embodiments be contoured so that light 1014 emitted towards the transparent cap 1016 is reflected back towards the emitting surface in a manner that reduces the divergence of light. In these types of embodiments, the shaped transparent structure 1016 is conductive and may form an ohmic contact to a Gallium Nitride layer. The cap 1018 and the sidewall 1020 of the Gallium Nitride emitter may both be contoured by etching to leave a suitable one or two dimensional cross-sectional shape which may be sloped, conical, domed parabolic, or alternatively an aspheric structure. The reflecting surface 1018 may also be shaped to act as a Fresnel mirror. The reflective second surface mirror surface may extend to include the side wall below the quantum well.

In some embodiments, thee distance from the top of the structure to the bottom of the sidewall is between 1 and 10 microns. The diameter of the individual emitter is less than 2× the height e.g. a device of 2 microns height will have emitters of 4 microns diameter or less. The material chosen for the cap 1016 has a high refractive index, such as greater than 1.5 and preferably more than 2.0 in order to reduce losses at the interface with the GaN layer. In one example, the cap 1016 has a refractive index of ~2.4 to match GaN. The sidewall angle of the structure should be chosen according to the type of cap shape chosen and the refractive index of the material used but should normally be greater than 5° from vertical, and preferably 45±30° from vertical.

The foregoing description of the embodiments has been presented for the purpose of illustration; it is not intended to be exhaustive or to limit the patent rights to the precise forms disclosed. Persons skilled in the relevant art can appreciate that many modifications and variations are possible in light of the above disclosure.

The language used in the specification has been principally selected for readability and instructional purposes, and it may not have been selected to delineate or circumscribe the inventive subject matter. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. A method, comprising:
   releasing a first amount of fluidic material from a tip of a pick-up head to form a fluidic membrane on the tip, the fluidic material being a liquid;
   bringing the fluidic membrane on the tip of the pick-up head in contact with a semiconductor device on a carrier substrate to attach the semiconductor device to the fluidic membrane;
   removing the semiconductor device from the carrier substrate by lifting the pick-up head with the semiconductor device attached to the fluidic membrane on the tip of the pick-up head;
   aligning, with the pick-up head, the semiconductor device with a location on a target substrate; and
   releasing a second amount of the fluidic material from the tip of the pick-up head to separate the semiconductor device from the pick-up head.

2. The method of claim 1, wherein:
   the carrier substrate is a carrier tape; and
   the method further includes:
      fabricating a plurality of semiconductor devices including the semiconductor device on a native substrate;
      transferring the plurality of semiconductor devices to the carrier tape;
      singulating the plurality of semiconductor devices on the carrier tape; and
      spatially separating the plurality of semiconductor devices by expanding the carrier tape.

3. The method of claim 2, wherein the plurality of semiconductor devices are singulated by a laser beam directed through the carrier tape, the laser beam heating the carrier tape to reduce an adhesion force between the semiconductor device and the carrier tape.

4. The method of claim 2, wherein:
   the target substrate is a display substrate; and
   the semiconductor device is a light emitting diode (LED).

5. The method of claim 1, wherein:
   the target substrate is an intermediate carrier substrate; and
   the method further includes transferring the semiconductor device on the intermediate carrier substrate to a display substrate using a direct bonding process.

6. The method of claim 1, wherein releasing the second amount of the fluidic material from the tip of the pick-up head causes the first and second amounts of the fluidic material to cover at least a portion of the semiconductor device.

7. The method of claim 6, wherein:
   the semiconductor device is a LED configured to emit first color light; and
   the fluidic material is a color converting material that forms a color conversion layer on the semiconductor device to convert the first color light into a second color light.

8. The method of claim 6, wherein the first and second amounts of the fluidic form a protective layer that encapsulates the semiconductor device.

9. The method of claim 6, wherein the first and second amounts of the fluidic material include conductive material that forms an electrical connection between the semiconductor device and the target substrate.

10. The method of claim 6, further comprising evaporating the first and second amounts of the fluidic material covering the at least a portion of the semiconductor device on the target substrate to remove the fluidic material from the semiconductor device.

11. The method of claim 1, further comprising:
    selecting a subset of tips from an array of tips including the tip to release first amounts of the fluidic material;
    releasing the first amounts of the fluidic material from the subset of tips to form a fluidic membrane on each of the subset of tips;
    bringing the fluidic membranes on the subset of tips in contact with a subset of semiconductor devices to attach the subset of semiconductor devices to the fluidic membrane;
    aligning, with the array of tips, the subset of semiconductor devices with a plurality of locations on the target substrate; and
    releasing second amounts of the fluidic material from the subset of tips to separate the plurality of semiconductor devices from the plurality of tips and place the plurality of semiconductor devices at the plurality of locations on the target substrate.

12. The method of claim 11, further comprising, prior to bringing the fluidic membranes on the subset of tips in contact with the subset of semiconductor devices, aligning the subset of tips with the subset of semiconductor devices on the carrier substrate by expanding the carrier substrate to spatially separate the semiconductors devices.

13. A display panel fabricated by a method, comprising:
    releasing a first amount of fluidic material from a tip of a pick-up head to form a fluidic membrane on the tip, the fluidic material being a liquid;
    bringing the fluidic membrane on the tip of the pick-up head in contact with a light emitting diode (LED) on a carrier substrate to attach the LED to the fluidic membrane;
    removing the LED from the carrier substrate by lifting the pick-up head with the LED attached to the fluidic membrane on the tip of the pick-up head;
    aligning, with the pick-up head, the LED with a location on a target substrate; and
    releasing a second amount of the fluidic material from the tip of the pick-up head to separate the LED from the pick-up head and place the LED at the location on the target substrate.

14. The display panel of claim 13, wherein:
    the target substrate is a display substrate of the display panel; or
    the target substrate is an intermediary carrier substrate, the LED is transferred to the display substrate from the intermediary carrier substrate using a direct bonding process.

15. The display panel of claim 13, wherein:
the carrier substrate is a carrier tape; and
the method further includes:
- fabricating a plurality of LEDs including the LED on a native substrate;
- transferring the plurality of LEDs to the carrier tape;
- singulating the plurality of LEDs on the carrier tape; and
- spatially separating the plurality of LEDs by expanding the carrier tape.

16. The display panel of claim 15, wherein the plurality of LEDs are singulated by a laser beam directed through the carrier tape, the laser beam heating the carrier tape to reduce an adhesion force between the LED and the carrier tape.

17. The display panel of claim 13, wherein
the LED is configured to emit first color light; and
the first and second amounts of the fluidic material is a color converting material that forms a color conversion layer on the LED to convert the first color light into a second color light.

18. The display panel of claim 13, wherein the first and second amounts of the fluidic material include conductive material that forms an electrical connection between the LED and the target substrate.

19. The display panel of claim 13, wherein the method further includes evaporating the first and second amounts of the fluidic material covering at least a portion of the LED on the target substrate to remove the fluidic material from the LED.

* * * * *